United States Patent [19]

Kunishi et al.

[11] Patent Number: 4,677,649

[45] Date of Patent: Jun. 30, 1987

[54] DATA RECEIVING APPARATUS

[75] Inventors: Kosuke Kunishi, Tokyo; Hiroyuki Mikada, Yokohama; Tsunehiro Watanabe, Tokyo, all of Japan

[73] Assignee: Canon Kabushiki Kaisha, Tokyo, Japan

[21] Appl. No.: 601,356

[22] Filed: Apr. 18, 1984

[30] Foreign Application Priority Data

Apr. 26, 1983 [JP] Japan ................................ 58-72165
Apr. 26, 1983 [JP] Japan ................................ 58-72166

[51] Int. Cl.$^4$ ...................... H04B 1/66; H04N 1/419
[52] U.S. Cl. .................................... 375/122; 358/260; 358/261; 360/8
[58] Field of Search .................. 375/75, 122; 358/261, 358/256, 257, 260; 381/29, 34, 35, 41; 360/8; 364/513.5

[56] References Cited

U.S. PATENT DOCUMENTS

| | | | |
|---|---|---|---|
| 3,360,778 | 12/1967 | Farrell | 364/900 |
| 3,452,330 | 6/1969 | Avery | 364/900 |
| 3,500,336 | 3/1970 | Cuccio | 358/148 |
| 3,749,836 | 7/1973 | Hayami et al. | 358/256 |
| 4,178,549 | 12/1979 | Ledenbach et al. | 375/75 X |
| 4,432,020 | 2/1984 | Onose et al. | 358/257 |
| 4,441,208 | 4/1984 | Iida | 358/261 |
| 4,445,195 | 4/1984 | Yamamoto | 358/256 |

Primary Examiner—Robert L. Griffin
Assistant Examiner—M. Huseman
Attorney, Agent, or Firm—Fitzpatrick, Cella, Harper & Scinto

[57] ABSTRACT

The present invention provides a data receiving apparatus constituted in such a manner that the received data is converted into a binary code and this binary code data is encoded and this encoded data is stored in a memory, whereby a large quantity of data can be stored in a memory of a small capacity. After subsequently decoding the received encoded data, this decoded data is further encoded by another encoding means and this encoded data is stored in the memory, thereby providing an efficient and economical data receiving apparatus which can smoothly perform the data processing even in the case where the transmission speed of the data and the recording speed of the recording apparatus remarkably differ.

6 Claims, 4 Drawing Figures

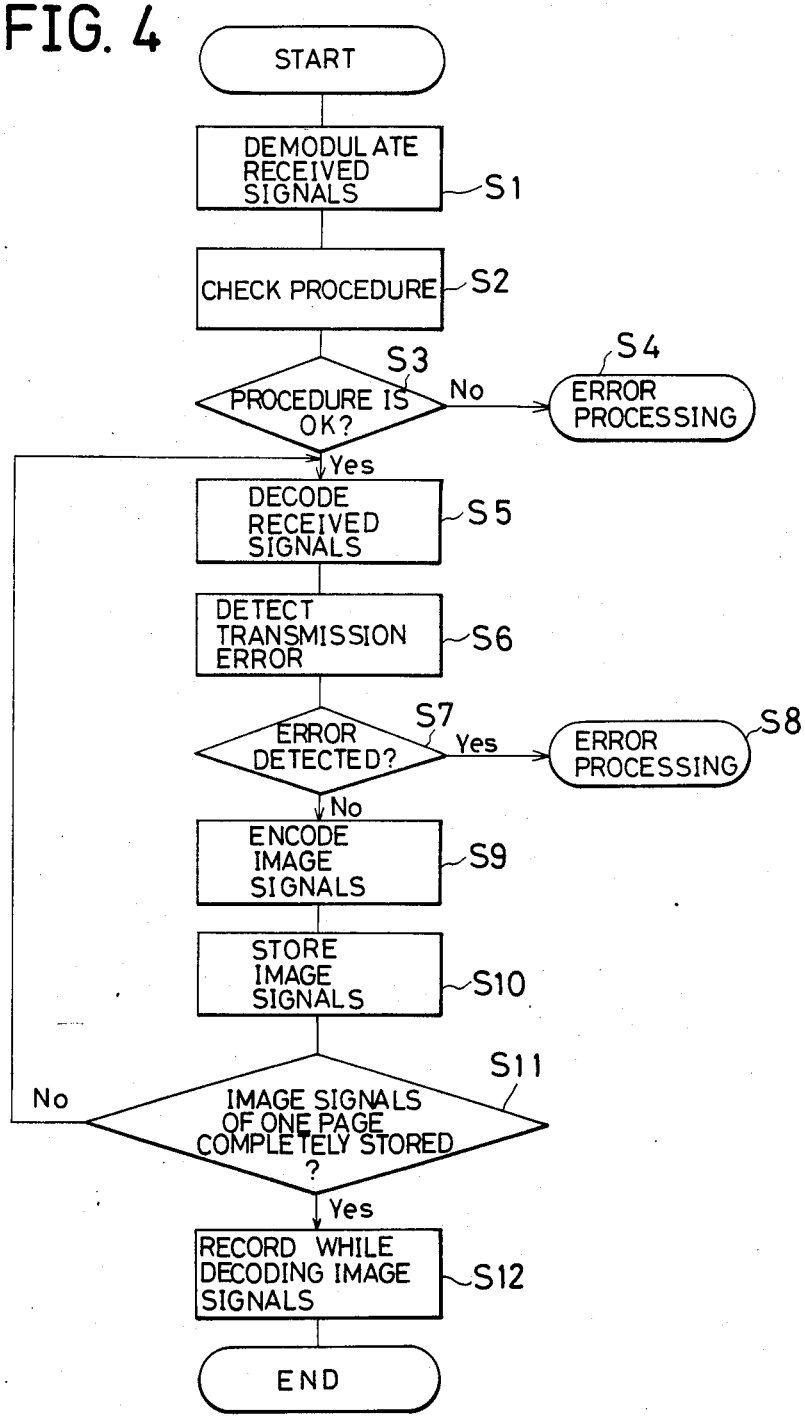

DATA RECEIVING APPARATUS

BACKGROUND OF THE INVENTION

1. Field of the Invention

The present invention relates to a data receiving apparatus which is provided with a memory to store the received data and in which memory capacity is substantially increased by storing the data in the memory with high density.

2. Description of the Prior Art

In data communication units such as a facsimile apparatus of group 1 or 2 or the like which can meet the CCITT recommendation T2 or T3, there is conventionally known a unit provided with a buffer memory to store the received image data into an apparatus on the reception side. In this type of unit, a relatively large quantity of data can be transferred to the apparatus on the reception side irrespective of the processing speed of the recording apparatus at the post stage or the like; therefore, the time when the lines are used is small and there is also an advantage such that it is possible to use cheap processing apparatuses such as the recording apparatus and the like having a relatively low processing speed.

However, in the conventional data communication unit such as a facsimile apparatus of group 1 or 2 or the like, in the case of storing the received data in the buffer memory, after the received data has been demodulated and converted into binary code (hereinafter "received data" will be used to refer to the data before demodulation, and "demodulated data" to the data after demodulation, where the context does not make the meaning explicit), it is stored as is in the buffer memory, resultint in the drawbacks that a great amount of memory capacity is needed and that it is difficult to store a large quantity of data. In addition, in the conventional data communication unit such as a facsimile apparatus of group 3 or the like, in the case of storing the received data in the buffer memory, after the encoded data has been demodulated, it is transferred as is to the buffer memory, again resulting in the drawbacks that a great amount of memory capacity is required and that it is difficult to store a large quantity of data. Furthermore, this means that in the case where there is a limitation for the memory capacity, the transmission has to be interrupted at the time of overflow of the memory, which causes the acquisition time of the lines to become long.

SUMMARY OF THE INVENTION

It is an object of the present invention to store a large quantity of data using a cheap memory of small capacity.

Another object of the invention is to smoothly, efficiently and econimically perform the data processing even in the case where the transmission speed of the data and the recording speed of a recording apparatus remarkably differ.

According to the present invention, the foregoing objects are attained by providing a data receiving apparatus in which coded data received from a data communication line is demodulated and decoded, and then encoded using a different encoding method, and stored in its re-encoded form. The data is taken from the memory where it is stored, for recording.

These and other objects features and advantages of the invention will be more fully appreciated from a consideration of the following detailed description of the preferred embodiments, taken together with the accompanying drawings.

BRIEF DESCRIPTION OF THE DRAWINGS

FIG. 4 is a flowchart showing the control procedure in FIG. 3.

DETAILED DESCRIPTION OF THE PREFERRED EMBODIMENTS

Figure 1:
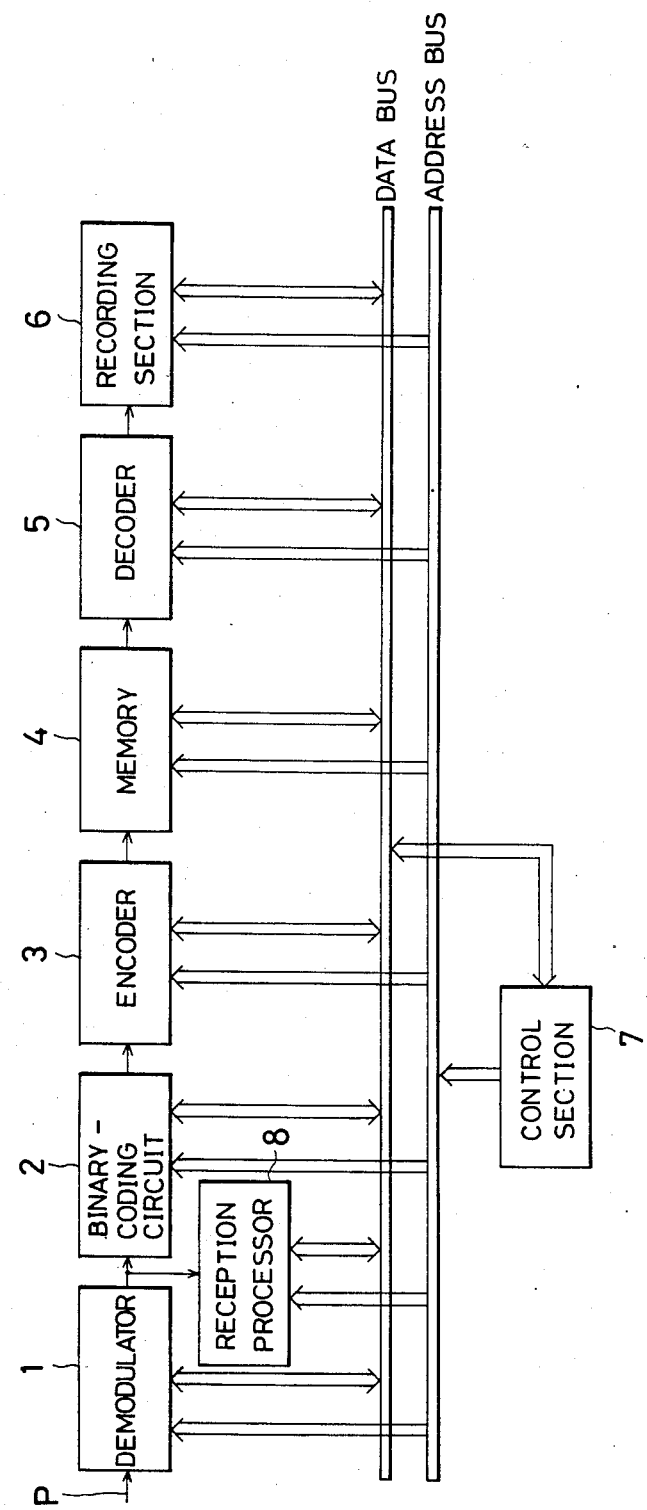
FIG. 1 is a block diagram showing a first embodiment of a data receiving apparatus of the present invention.

The present invention will now be described in detail hereinbelow with respect to the preferred embodiments, shown in the drawings. FIG. 1 shows a constitution of a facsimile apparatus of group 2 or 1 as a first embodiment of a data receiving apparatus of the present invention. In the drawing, a reference character P denotes a telephone line and the received data transmitted from this telephone line P is directed to a demodulator 1. In the facsimile apparatus of group 2 or 1, since the data is transmitted as analog data, it cannot be stored as it is in a memory 4 at the post stage; therefore, the output data of the demodulator 1 is sent to a binary-coding circuit 2, where it is converted into binary data.

In addition, the output data of the demodulator 1 is also transmitted to a reception processor 8 and the reception processor 8 supervises the demodulated data, thereby to detect the error which has occurred during the communication due to the transmission.

In this invention, the demodulated data is encoded by an encoder 3 before being stored in the memory 4. This encoding may be performed in accordance with a modified Huffman method or with other methods. However, in this case, it is desirable to use an encoding method such that real time decoding can be easily performed in a decoder 5 which will be mentioned later. Accordingly, the modified Huffman method and the like are suitable.

A code table according to the modified Huffman method is shown in table 1.

TABLE 1

| Run length | Code words for white run | Code words for black run |
|---|---|---|
| (A) Terminating Codes | | |
| 0 | 00110101 | 0000110111 |
| 1 | 000111 | 010 |
| 2 | 0111 | 11 |
| 3 | 1000 | 10 |
| 4 | 1011 | 011 |
| 5 | 1100 | 0011 |
| 6 | 1110 | 0010 |
| 7 | 1111 | 00011 |
| 8 | 10011 | 000101 |
| 9 | 10100 | 000100 |
| 10 | 00111 | 0000100 |
| 11 | 01000 | 0000101 |
| 12 | 001000 | 0000111 |
| 13 | 000011 | 00000100 |
| 14 | 110100 | 00000111 |
| 15 | 110101 | 000011000 |
| 16 | 101010 | 0000010111 |
| 17 | 101011 | 0000011000 |
| 18 | 0100111 | 0000001000 |
| 19 | 0001100 | 00001100111 |
| 20 | 0001000 | 00001101000 |
| 21 | 0010111 | 00001101100 |

TABLE 1-continued

| Run length | Code words for white run | Code words for black run |
|---|---|---|
| 22 | 0000011 | 00000110111 |
| 23 | 0000100 | 00000101000 |
| 24 | 0101000 | 00000010111 |
| 25 | 0101011 | 00000011000 |
| 26 | 0010011 | 000011001010 |
| 27 | 0100100 | 000011001011 |
| 28 | 0011000 | 000011001100 |
| 29 | 00000010 | 000011001101 |
| 30 | 00000011 | 000001101000 |
| 31 | 00011010 | 000001101001 |
| 32 | 00011011 | 000001101010 |
| 33 | 00010010 | 000001101011 |
| 34 | 00010011 | 000011010010 |
| 35 | 00010100 | 000011010011 |
| 36 | 00010101 | 000011010100 |
| 37 | 00010110 | 000011010101 |
| 38 | 00010111 | 000011010110 |
| 39 | 00101000 | 000011010111 |
| 40 | 00101001 | 000001101100 |
| 41 | 00101010 | 000001101101 |
| 42 | 00101011 | 000011011010 |
| 43 | 00101100 | 000011011011 |
| 44 | 00101101 | 000001010100 |
| 45 | 00000100 | 000001010101 |
| 46 | 00000101 | 000001010110 |
| 47 | 00001010 | 000001010111 |
| 48 | 00001011 | 000001100100 |
| 49 | 01010010 | 000001100101 |
| 50 | 01010011 | 000001010010 |
| 51 | 01010100 | 000001010011 |
| 52 | 01010101 | 000000100100 |
| 53 | 00100100 | 000000110111 |
| 54 | 00100101 | 000000111000 |
| 55 | 01011000 | 000000100111 |
| 56 | 01011001 | 000000101000 |
| 57 | 01011010 | 000001011000 |
| 58 | 01011011 | 000001011001 |
| 59 | 01001010 | 000000101011 |
| 60 | 01001011 | 000000101100 |
| 61 | 00110010 | 000001011010 |
| 62 | 00110011 | 000001100110 |
| 63 | 00110100 | 000001100111 |
| (B) Make up Codes | | |
| 64 | 11011 | 0000001111 |
| 128 | 10010 | 000011001000 |
| 192 | 010111 | 000011001001 |
| 256 | 0110111 | 000001011011 |
| 320 | 00110110 | 000000110011 |
| 384 | 00110111 | 000000110100 |
| 448 | 01100100 | 000000110101 |
| 512 | 01100101 | 0000001101100 |
| 576 | 01101000 | 0000001101101 |
| 640 | 01100111 | 0000001001010 |
| 704 | 011001100 | 0000001001011 |
| 768 | 011001101 | 0000001001100 |
| 832 | 011010010 | 0000001001101 |
| 896 | 011010011 | 0000001110010 |
| 960 | 011010100 | 0000001110011 |
| 1024 | 011010101 | 0000001110100 |
| 1088 | 011010110 | 0000001110101 |
| 1152 | 011010111 | 0000001110110 |
| 1216 | 011011000 | 0000001110111 |
| 1280 | 011011001 | 0000001010010 |
| 1344 | 011011010 | 0000001010011 |
| 1408 | 011011011 | 0000001010100 |
| 1472 | 010011000 | 0000001010101 |
| 1536 | 010011001 | 0000001011010 |
| 1600 | 010011010 | 0000001011011 |
| 1664 | 011000 | 0000001100100 |
| 1728 | 010011011 | 0000001100101 |
| EOL | 00000000001 | 00000000001 |

Table 1(A) shows the terminating codes to be solely applied in the case where the length (run length) of the continuous data of white pixels (white run) or of the continuous data of black pixels (black run) is 0 to 63 pixels. Table 1(B) shows the make up codes to be applied in combination with the terminating codes shown in Table 1(A) in the case where the run length of white run or black run is 64 or more pixels. For example, in the case of storing the demodulated data of 63 pixels in the memory 4 shown in FIG. 1, when the output of the binary-coding circuit 2 is directly input to the memory 4 without using the encoder 3, the capacity of 63 bits is used in the memory 4. However, as shown in FIG. 1, if the encoder 3 is used, for instance, in the case where all the data of 63 pixels are the data regarding to the white pixels, it is indicated by "0 0 1 1 0 1 0 0" as the code word for white run corresponding to the run length 63 in table 1(A); therefore only, the capacity of 8 bits is used. In this way, since the data encoded by the encoder 3 is stored in the memory 4, the capacity of the memory 4 may be relatively small.

The data in the memory 4 is read out little by little through the decoder 5, which is of the same type as the encoder 3, according to the recording speed of a recording section 6 by a thermal printer or the like, and the image processing such as the image recording or the like is performed by the recording section 6.

Figure 2:
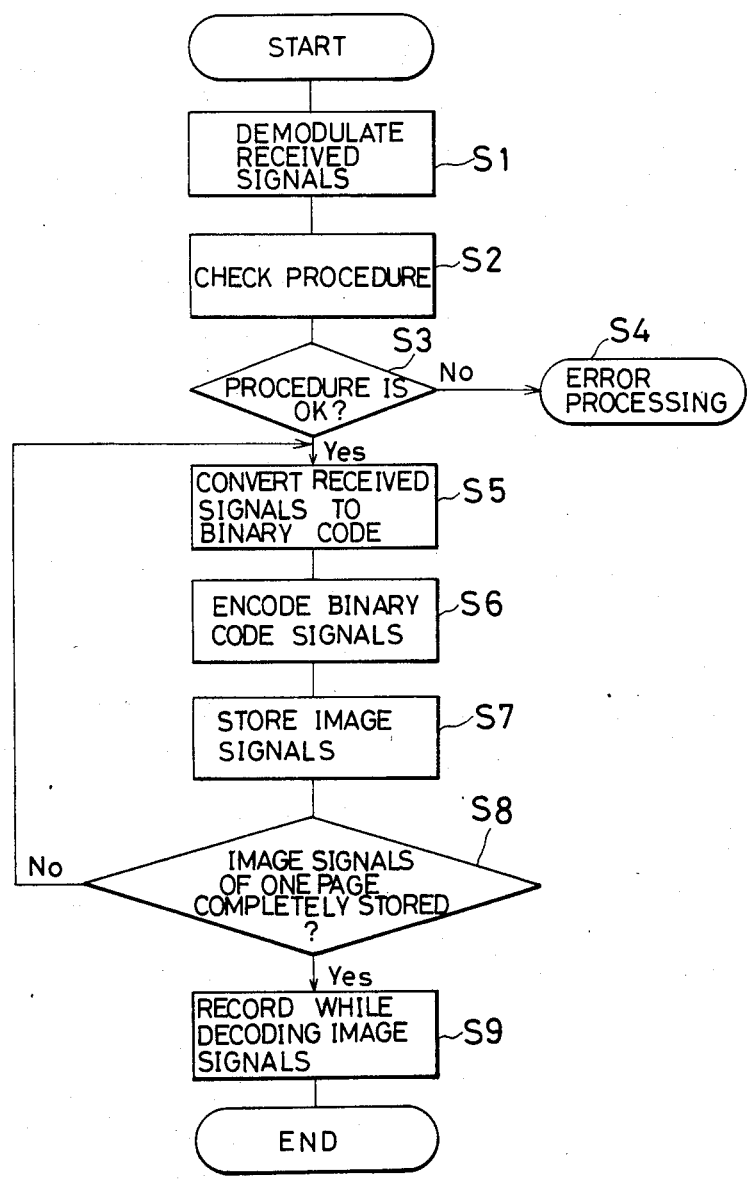
FIG. 2 is a flowchart showing the control procedure in FIG. 1.

Each of the above-mentioned sections operates in accordance with the control of a control section 7 constituted by a microcomputer. FIG. 2 is a flowchart to show the control procedure of this control section 7.

In step S1 in FIG. 2, the control section 7 controls the demodulator 1 to perform the demodulation of the received data. Steps S1 to S3 have a loop constitution in detail and the facsimile procedure to be determined by the reception processor 8 is checked in step S2 upon demodulation to determine whether it is correctly executed or not. In the case where the procedure is not appropriately performed, the processing advances from step S3 to step S4, thereby performing error processings such as the output of an error message and cut-off of the line, etc.

Then in step S5, the demodulated data is converted into the binary code by the binary-coding circuit 2. The binary code data is encoded by the encoder 3 in step S6 and the encoded data is stored in the memory 4 in step S7. Subsequently in step S8, it is checked to determine whether or not a predetermined amount image data, for instance, data for one page of an original document of A4 size or the like is completely stored. If the predetermined amount of data has not been stored yet, the procedure will be returned to S5 and the processings will be continued.

In the case where the predetermined amount of image data is completely stored, the image data is recorded in step S9. In this case, the data is read out according to the processing speed of the recording section 6 and is decoded in real time by the decoder 5, after which the image processing is carried out by the recording section 6.

In the foregoing constitution, in the case where the apparatus is the general apparatus having the group 3 mode also, the encoded data is transmitted due to the digital transmission; therefore, the output of the demodulator 1 may be directly sent to the memory 4. However, even in this case, it is necessary to supervise the procedure for transmission error.

The adoption of the above method and constitution of the apparatus enables the capacity of the memory in which the received data is stored to be remarkably reduced. Contrarily speaking, it is possible to store a larger quantity of data in the memory of the same capacity as that of the conventional one. Due to this, in the facsimile apparatus and the like, even in the case of a cheap and low-speed recording apparatus, the data transmission can be finished in a short time irrespective of the processing speed of the recording apparatus.

On the contrary, in the case where the recording speed is remarkably faster than the transmitting speed and the page memory is similarly necessary in the facsimile apparatus and the like, a large quantity of data can be stored similarly in the memory of small capacity, thereby enabling the number of memory devices to be reduced. In addition, in the case where the recording system presents a high speed as mentioned above, the page memory is needed at the front stage of the recording section 6 so that the recording data is transferred to the recording section without being interrupted; however, in the present invention, since the memory 4 is the page memory as described before, the page memory necessary in the recording section is unnecessary, so that even a small scale line buffer may suffice. This line buffer is assumed to be incorporated in the recording section 6 and is not shown in FIG. 1.

As is obvious from the above description, in the first embodiment of the present invention, since there has been adopted the constitution whereby after the received data to be processed is converted into binary code, it is encoded and is stored in the memory, a larger quantity of data can be stored in a memory of small capacity with a simple and cheap constitution. Therefore, it is possible to provide the data receiving apparatus which can efficiently and economically perform the data transmission.

Figure 3:
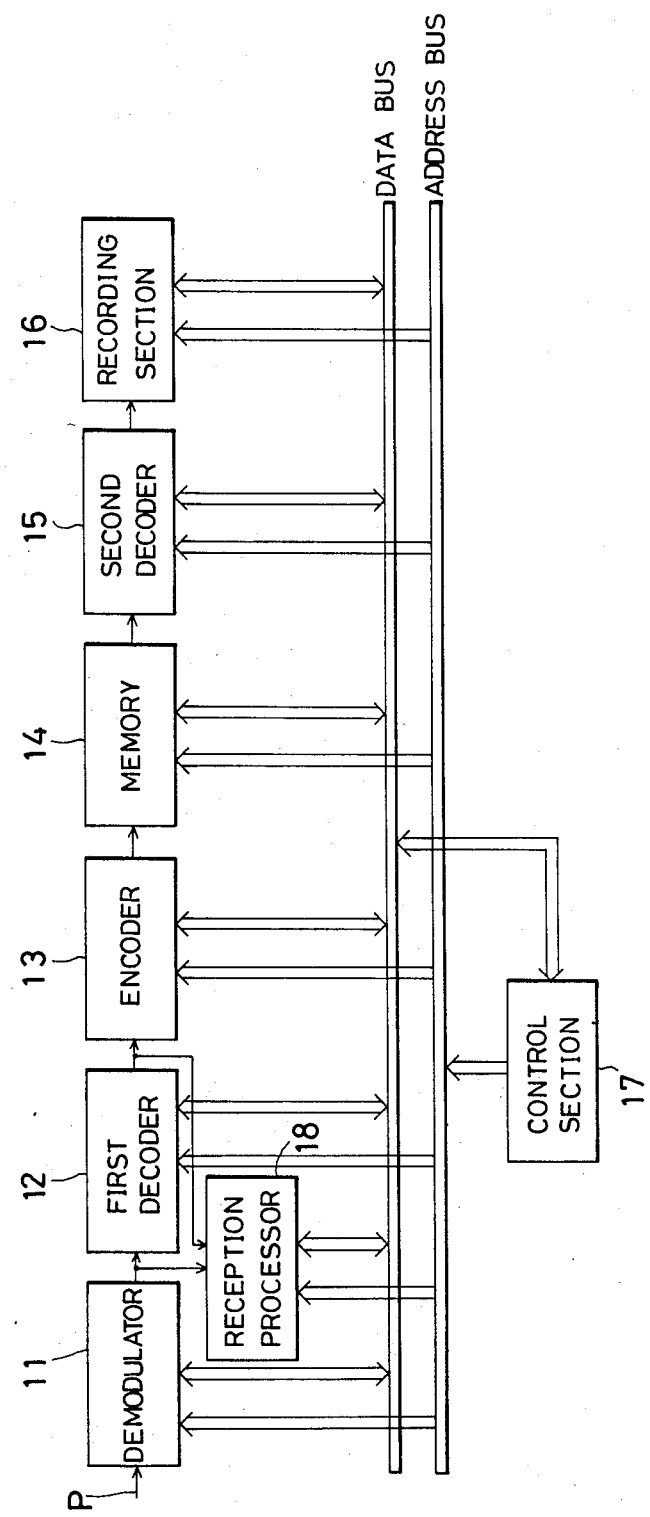
FIG. 3 is a block diagram showing a second embodiment of the data receiving apparatus of the present invention.

Next, FIG. 3 shows a constitution of a facsimile apparatus of group 3 as a second embodiment of the data receiving apparatus of the present invention. In the drawing, the received data transmitted from the telephone line P is directed to a demodulator 11. In the group-3 facsimile apparatus, the data is encoded and transmitted in accordance with the modified Huffman or modified READ method or with other methods for the purpose of suppression of redundancy; thus, the received data demodulated by the demodulator 11 is sent to a first decoder 12 and is decoded.

The first decoder 12 decodes the received data in accordance with the decoding method corresponding to the encoding method of the received data.

The input/output data of the first decoder 12 is transmitted to a reception processor 18 and the demodulated data and decoded data are supervised by this reception processor 18, thereby detecting any error which has occurred during the communication.

In this embodiment, before the received data is stored in a memory 14, it is encoded again by an encoder 13. For this encoding, an encoding method different from the encoding method of the received data is adopted in principle and the encoding may be performed by the foregoing modified Huffman method or by other methods. However, in this case, it is desirable to encode according to an encoding method such that the real time decoding can be easily performed by a second decoder 15 which will be mentioned later. Therefore, the modified Huffman method and the like are proper. Since the data encoded by an encoder 13 is stored in the memory 14, the capacity of the memory 14 may be relatively small for the reason already mentioned before.

The data in the memory 14 is gradually read out through the second decoder 15 of the same type as the encoder 13 according to the processing speed of the recording section 16 constituted by a thermal printer or the like, and the image processing such as the picture recording or the like is carried out by a recording section 16. Thus, even in the case where the transmitting speed of the data and the recording speed of the recording apparatus are quite different, it is possible to satisfactorily cope with the difference.

Each of the above-mentioned sections operates in accordance with the control of a control section 17 constituted by a microcomputer. FIG. 4 is a flowchart showing the control procedure of this control section 17.

In step S1 in FIG. 4, the control section 17 controls the demodulator 11 to demodulate the received data. Steps S1 to S3 have a loop constitution in detail and the facsimile procedure to be determined by the reception processor 18 is checked in step S2 upon demodulation to determine whether it is correctly executed or not. In the case where the procedure is not properly performed, the processing advances from step S3 to step S4, thereby performing error processings such as the output of an error message and cut-off of the line, etc.

Next, in step S5, the demodulated data is decoded by the first decoder 12. In detail, steps S5 to S7 also have a loop constitution and during the decoding operation, it is observed by the reception processor 18 in step S6 whether a transmission error is detected or not. In the case where the occurrence a transmission error is detected due to the discrimination in step S7, the procedure advances to S8 and similar error processing to that in step S4 is carried out.

The data thus decoded is encoded by the encoder 13 in step S9 and the resulting encoded data is stored in the memory 14 in step S10. Subsequently in step S11, it is checked to determine whether or not a predetermined amount of image data, e.g., of one page of an original document of A4 size or the like, is completely stored. If such an amount of data has not been stored yet, the processing will be returned to step S5 and the processings will be continued.

In the case where such an amount of image data has been completely stored, the image data is recorded in step S12. In this case, the data is read out according to the processing speed of the recording section 16 and is decoded in real time by the second decoder 15, whereafter the image processing is carried by the recording section 16.

In the foregoing constitution, in the case where the encoding method of the encoder 13 is identical to that of the received data to be transmitted in the manner such as the modified Huffman transmission in the facsimile apparatus of group 3 or the like the first decoder 12 and encoder 13 may be omitted and the output of the demodulator 11 may be directed as is to the memory 14. However, even in this case, it is necessary to supervise the procedure or transmission error.

The adoption of the foregoing method and apparatus enables the capacity of the memory in which the received data is stored to be remarkably reduced. Contrarily speaking, a larger quantity of data can be stored in a memory of the same capacity as the conventional one. Due to this, it is possible to relatively easily realize a facsimile apparatus in which the transmitting speed of the data and recording speed of the recording apparatus will remarkably differ. For example, in the case of the facsimile apparatus in which the recording speed is slower than the transmitting speed, since unrecorded data will have been collected, an additional buffer to store them is needed; but this buffer can be easily realized according to the present invention. Moreover, even in the case of a cheap and a low-speed recording apparatus, the data transmission can be finished in a short time irrespective of the processing speed of the recording apparatus.

On the contrary, in the case where the recording speed is remarkably faster than the transmitting speed and the page memory is similarly necessary in the facsimile apparatus and the like, a large quantity of data can be stored similarly in the memory of small capacity, thereby enabling the number of memory devices to be reduced. In addition, in the case where the recording system presents a high speed as mentioned above, the page memory is needed at the front stage of the recording section 16 so that the recording data is transmitted to the recording section without being interrupted; however, in the present invention, since the memory 14 is the page memory, a page memory in the recording section 16 is unnecessary, so that a small scale line buffer may suffice. This line buffer is assumed to be incorporated in the recording section 16 and is not shown in FIG. 3.

As is obvious from the above description, even in the second embodiment of the present invention, since the constitution whereby the received data to be processed is encoded and stored in the memory has been adopted, a larger quantity of data can be stored in the memory of small capacity with a simple and cheap constitution. Therefore, it is possible to provide the data receiving apparatus which can efficiently and economically perform the data transmission.

What is claimed is:

1. A data receiving apparatus comprising:
    demodulating means for demodulating coded data received from a data communication line;
    first converting means for decoding the coded data demodulated by said demodulating means according to an encoding method of said coded data;
    second converting means for encoding the data decoded by said first converting means in accordance with an encoding method different from the encoding method of coded data received from the date communication line;
    memory means for storing the data encoded by said second converting means; and
    recording means for recording the data stored in said memory means.

2. A data receiving apparatus according to claim 1, wherein
    said second converting means performs the encoding processing of a modified Huffman method for the data decoded by said first converting means.

3. A data receiving apparatus comprising:
    first converting means for decoding received coded data in accordance with a decoding method corresponding to a first encoding method, the first encoding method being an encoding method of the coded data;
    second converting means for encoding the data decoded by said first converting means in accordance with a second encoding method, different from the first encoding method;
    memory means for storing the data encoded by said second converting means;
    third converting means for decoding the data stored in said memory means using a decoding method corresponding to the second encoding method; and
    recording means for recording in accordance with the data decoded by said third converting means.

4. A data receiving apparatus according to claim 3, wherein said second converting means and said third converting means perform the encoding and the decoding of the modified Huffman method, respectively.

5. A coded image data receiving apparatus comprising:
    converting means for converting received coded image data to second coded image data;
    memory means for storing the second coded image data;
    decoding means for decoding the second coded image data; and
    recording means for recording in accordance with the data decoded by said decoding means;
    wherein an encoding method of said received coded image data is different from an encoding method of said second coded image data.

6. An apparatus according to claim 5, wherein said converting means includes second decoding means for decoding said received coded image data, and encoding means for encoding the data obtained by said second decoding means.

* * * * *